(12) United States Patent
Liu et al.

(10) Patent No.: US 9,461,607 B2
(45) Date of Patent: Oct. 4, 2016

(54) BALANCE FILTER

(71) Applicants: Chen-Chung Liu, Hsinchu (TW); Ian-Chun Cheng, Miaoli County (TW)

(72) Inventors: Chen-Chung Liu, Hsinchu (TW); Ian-Chun Cheng, Miaoli County (TW)

(73) Assignee: CYNTEC Co., Ltd., Hsinchu (TW)

( * ) Notice: Subject to any disclaimer, the term of this patent is extended or adjusted under 35 U.S.C. 154(b) by 700 days.

(21) Appl. No.: 13/861,407

(22) Filed: Apr. 12, 2013

(65) Prior Publication Data
US 2013/0271241 A1    Oct. 17, 2013

Related U.S. Application Data

(63) Continuation-in-part of application No. 13/570,267, filed on Aug. 9, 2012.

(60) Provisional application No. 61/623,566, filed on Apr. 13, 2012.

(51) Int. Cl.
*H01P 5/12* (2006.01)
*H03H 7/01* (2006.01)
*H03H 7/42* (2006.01)

(52) U.S. Cl.
CPC ........... *H03H 7/0138* (2013.01); *H03H 7/422* (2013.01)

(58) Field of Classification Search
CPC .......... H01P 5/10; H03H 7/42; H03H 4/422; H03H 4/425; H03H 7/0138
USPC .............................................. 333/25, 26, 134
See application file for complete search history.

(56) References Cited

U.S. PATENT DOCUMENTS

| | | | | |
|---|---|---|---|---|
| 7,116,185 B2* | 10/2006 | Ohi | ........................... | H03H 7/42 333/100 |
| 7,812,702 B2* | 10/2010 | Mano | .................. | H01F 17/0006 336/200 |
| 2011/0291786 A1* | 12/2011 | Li | ........................... | H01F 21/08 336/200 |

* cited by examiner

*Primary Examiner* — Robert Pascal
*Assistant Examiner* — Kimberly Glenn
(74) *Attorney, Agent, or Firm* — Min-Lee Teng; Litron Patent & Trademark Office

(57) ABSTRACT

The invention discloses a balance filter formed from a combination of a first circuit and a second circuit, wherein both the first circuit and the second circuit have at least one through-hole via inductor. The balance filter is connected to an IC through a first terminal and a second terminal, wherein a power trace is disposed between the first circuit and the second circuit to deliver the power to the IC.

20 Claims, 15 Drawing Sheets

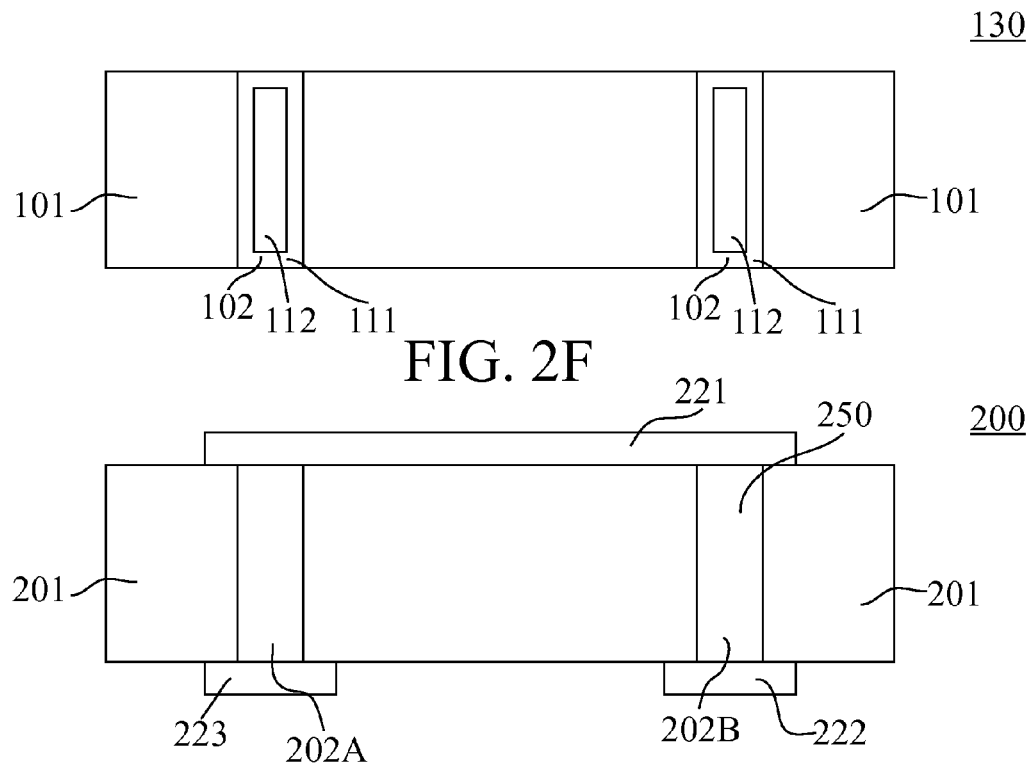
FIG. 2F
FIG. 3A
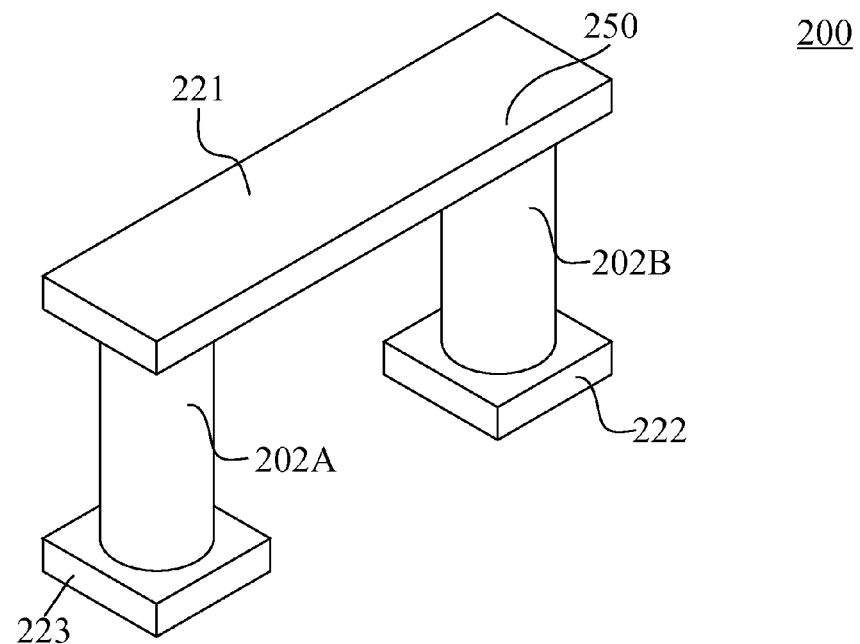
FIG. 3B

US 9,461,607 B2

BALANCE FILTER

CROSS REFERENCE TO RELATED APPLICATIONS

This application is a continuation-in-part of U.S. patent application Ser. No. 13/570,267, filed Aug. 9, 2012, and titled "A Through-Hole Via Inductor in a High-Frequency Device," which claims the benefit of priority of U.S. Provisional Patent Application No. 61/623,566, filed Apr. 13, 2012, and titled "A Through-Hole Via Inductor in a High-Frequency Device". All of these applications are incorporated by referenced herein in their entirety.

BACKGROUND OF THE INVENTION

I. Field of the Invention

The present invention relates to a filter and, in particular, to a balance filter.

II. Description of the Prior Art

Recently, the portable electronic and mobile communication products have gradually become lighter, thinner, smaller-sized, more multi-functional, more reliable and cheaper. There is a tendency to develop high-density devices. The active and passive devices have become smaller-sized, integrated, on-chip and in-module to reduce the costs and improve the competitiveness of the devices.

There are some technologies, such as MLCC (multi-layer ceramic capacitor), via-drilling and via-filling of a single-layer substrate or lithography process, to shrink the size of a device by maximizing the usage of the space within the device. Conventionally, please refer to FIG. 1, via-drilling and via-filling 2 can be performed in a single-layer ceramic substrate 1. Then, multiple single-layer ceramic substrates 1 can be combined into a multi-layer substrate 3 (by sintering) to form a through-hole via 4 in a multi-layer ceramic substrate. A through-hole via 4 is used to electrically connect two adjacent conductive layers. The above-mentioned through-hole via is only used for an electrical connection between different layers, and the space of the through-hole via will require a larger substrate for accommodating it. Therefore, what is needed is a solution to fully utilize the space of a through-hole via to further shrink the size of a device and to achieve better electrical performance of the device.

SUMMARY OF THE INVENTION

One objective of the present invention is to utilize a through-hole as an inductor to shrink the size of the device and to improve electrical performance.

In one embodiment, a balance filter is disclosed, wherein the balance filter comprises: a substrate; an input terminal to receive an input signal; a first circuit having a first terminal electrically connected to the input terminal and a second terminal to generate a first output signal, wherein the first circuit comprises a first through-hole via inductor substantially disposed in the substrate; and a second circuit electrically connected to the first circuit and having a third terminal to generate a second output signal, wherein the second circuit comprises a second through-hole via inductor substantially disposed in the substrate.

In one embodiment, a layout structure is disclosed, wherein the layout structure, comprises: a first layout having a first terminal electrically connected to an IC; a second layout electrically connected to the first layout and having a second terminal electrically connected to the IC, wherein the first layout is electrically connected to the second layout; and a first trace disposed between the first layout and the second layout, wherein one end of the first trace is electrically connected to a power supply and the other end of the first trace is electrically connected to the IC.

The detailed technology and above preferred embodiments implemented for the present invention are described in the following paragraphs accompanying the appended drawings for people skilled in this field to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein:

FIG. 2E and FIG. 2F illustrates a schematic cross-sectional view of the structure of the through-hole via inductor which comprises a conductive material and a non-conductive material.

FIG. 3A illustrates a schematic cross-sectional view of the structure of the U-shape through-hole via inductor.

FIG. 3B illustrates a three-dimensional perspective view of the U-shape through-hole via inductor, wherein the substrate is not shown.

DETAILED DESCRIPTION OF THE INVENTION

The detailed explanation of the present invention is described as following. The described preferred embodiments are presented for purposes of illustrations and description and they are not intended to limit the scope of the present invention.

The invention discloses that a conductive material in a through-hole via is used as an inductor (maybe called vertical inductor) for some high-frequency devices, such as a high-frequency filter. A through-hole via is used to electrically connect two adjacent conductive layers between which there is an insulating layer. In the process, the patterned conductive layer on the substrate and a through-hole in the substrate is made of the conductive material, wherein a through-hole via is filled with a small portion of the conductive material. Compared with the inductor made of a patterned conductive layer on the substrate, the inductor which is made of a small portion of the conductive material in the through-hole can be often ignored. In the present invention, it regards the conductive material in the through-hole in the substrate as a main inductor (named a through-hole via inductor hereafter), which can be often used in some high-frequency devices, such as a high-frequency filter. In a high-frequency operational environment (operated at not less than 1 GHz, preferably substantially at 2.4 GHz), the inductance of the conductive material in the through-hole will play an important role. For example, it can have a better Q value. The inductance of the through-hole via inductor can be computed by the simulation software to determine better electrical performance. Therefore, it can make conductive wires in circuit shorter, make the size of high-frequency device smaller and make electrical performance better.

Two terminals of the through-hole via inductor can be electrically connected to any other conductive element. In one example, one terminal can be electrically connected to a capacitor and the other terminal can be electrically connected to an inductor. In another example, one terminal can be electrically connected to a capacitor and the other terminal can be electrically connected to ground.

Figure 1:
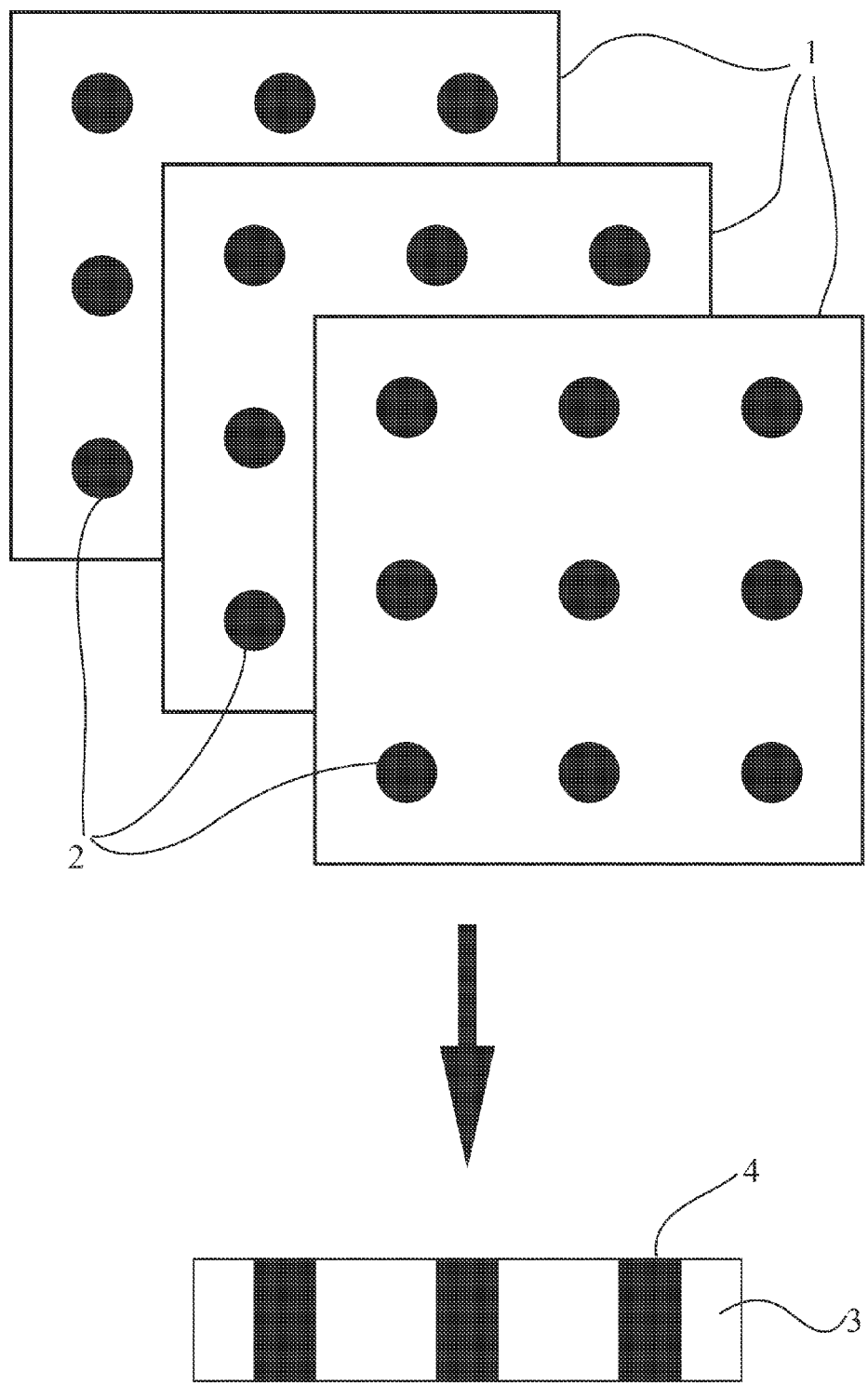
FIG. 1 illustrates a through-hole via in multi-layer substrate (by sintering).
Figure 2A:
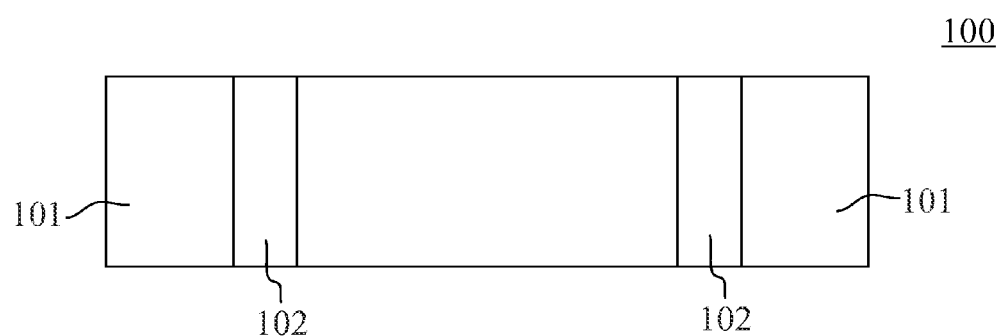
FIG. 2A illustrates a schematic cross-sectional view of the structure of the through-hole via inductor.
Figure 2B:
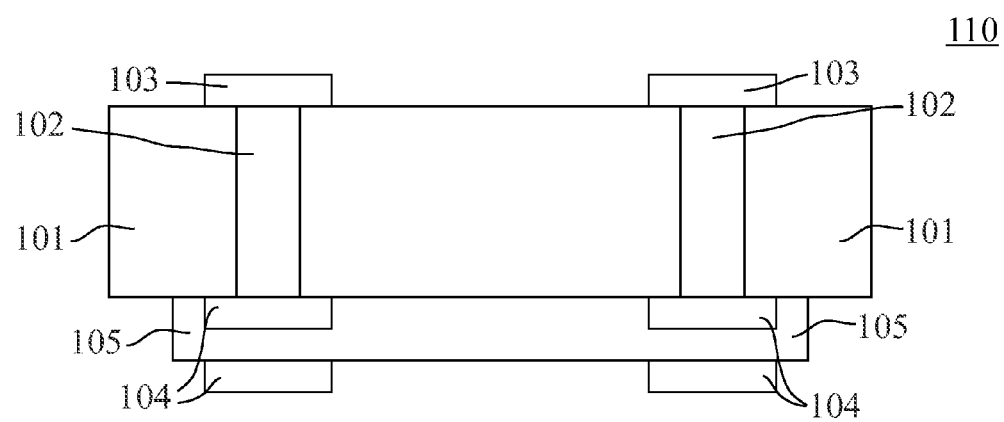
FIG. 2B illustrates a schematic cross-sectional view of the preferred structure made of a through-hole via inductor and a capacitor.

FIG. 2A illustrates a schematic cross-sectional view of the structure 100 of the through-hole via inductor. The structure 100 includes a substrate 101, a through-hole via inductor 102. FIG. 2B illustrates a schematic cross-sectional view of the preferred structure 110 made of a through-hole via inductor and a capacitor. The structure 110 includes a substrate 101, a through-hole via inductor 102, a horizontal inductor 103, a horizontal capacitor 104 and a dielectric layer 105. In the structure 100, 110, the inductance of the through-hole via inductor 102 plays an importance role (more critical than any other horizontal inductor 103) in high-frequency operational environment so that the structure 100, 110 can be applied to some high-frequency devices, such as a high-frequency filter. In one embodiment, the inductance of the through-hole via inductor 102 is greater than that of that horizontal inductor 103. In one embodiment, the resultant inductance of the through-hole via inductor 102 and the horizontal inductor 103 is substantially equal to the inductance of the through-hole via inductor 102. In one embodiment, the through-hole via inductor 102 includes at least two materials which are well designed in the through-hole via inductor 102 to achieve the above electrical characteristics, wherein one of said at least two materials is a conductive material. In one embodiment, the through-hole via inductor 102 has an integral body. The substrate 101 can be made of any suitable material, such as a dielectric substrate or a ceramic substrate (e.g., aluminum-oxide ($Al_2O_3$) substrate). The through-hole via inductor 102 can be made of any suitable material, such as Cu, Ag or a combination thereof. Preferably, the height of the through-hole via inductor 102 is about 320 μm and the width in diameter of the through-hole via inductor 102 is about 100 μm.

Figure 2C:
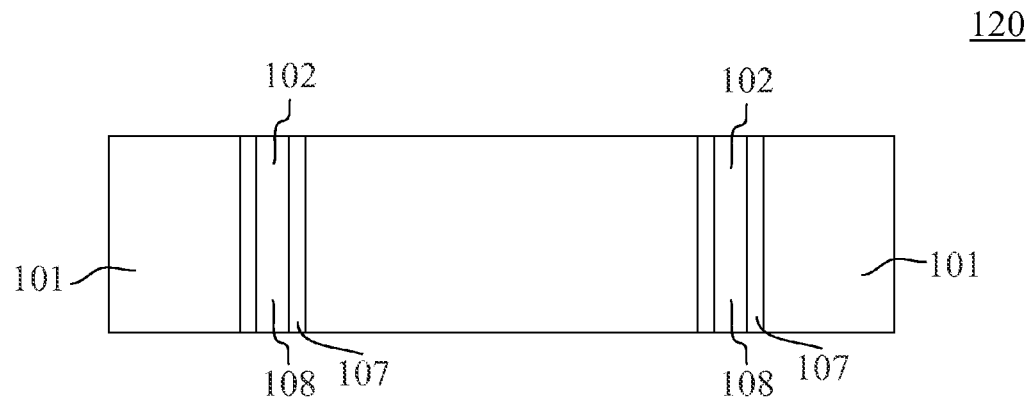
FIG. 2C and FIG. 2D illustrates a schematic cross-sectional view of the structure of the through-hole via inductor made of at least two conductive materials.
Figure 2D:
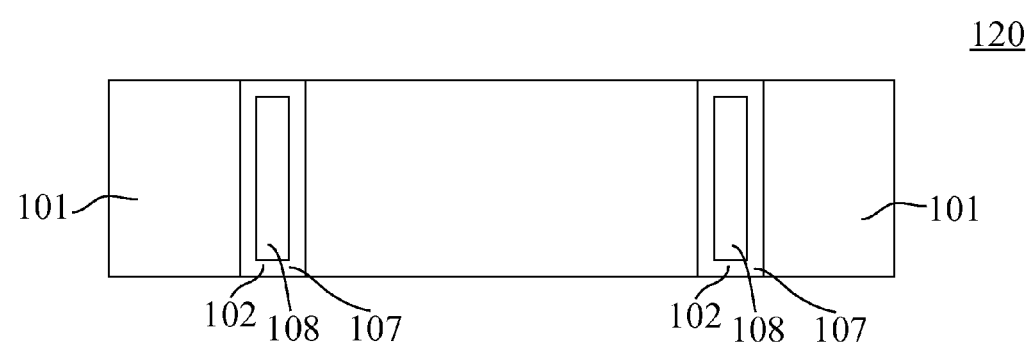

In one embodiment (structure 120), the through-hole via inductor 102 can be made of at least two conductive materials. Please refer to FIG. 2C and FIG. 2D, the through-hole via inductor 102 can be made of a first conductive material 107 overlaying the sidewall of the through-hole and a second conductive material 108 enclosed by the first conductive material 107. The first conductive material 107 can overlay the sidewall of the through-hole by electroplating or any suitable coating process. Preferably, the first conductive material 107 can be made of Cu and the second conductive material 108 can be made of Ag.

Figure 2E:

In another embodiment (structure 130), the through-hole via inductor 102 can comprise a conductive material 111 and a non-conductive material 112 enclosed by the conductive material 111 (refer to FIG. 2E and FIG. 2F).

Figure 3C:
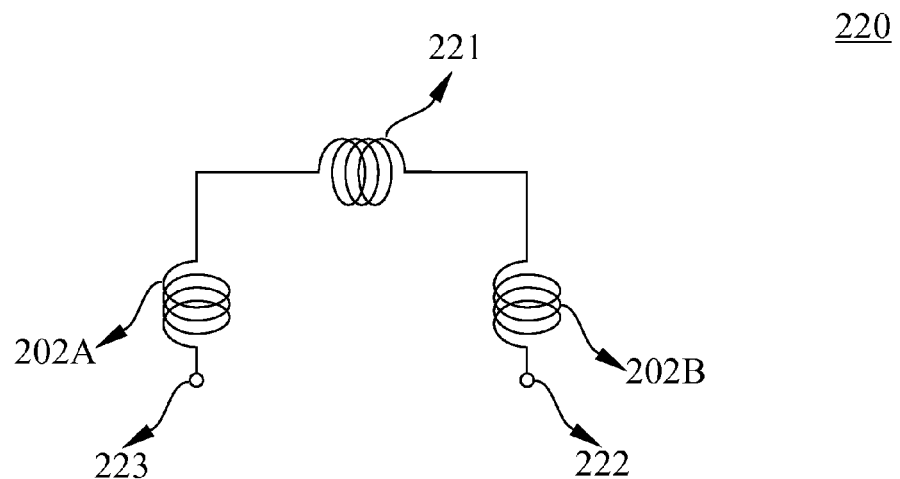
FIG. 3C illustrates an equivalent circuit of the U-shape through-hole via inductor.

The invention also discloses a U-shape through-hole via inductor made of a first through-hole via inductor in the substrate, a second through-hole via inductor in the substrate and a horizontal inductor on the substrate. One terminal of the horizontal inductor can be electrically connected to the first through-hole via inductor and the other terminal of the horizontal inductor can be electrically connected to the second through-hole via inductor. Please refer to FIG. 3A, the structure 200 includes a substrate 201, a horizontal inductor 221, a first through-hole via inductor 202A and a second through-hole via inductor 202B. FIG. 3B illustrates a three-dimensional perspective view of the U-shape through-hole via inductor 250, wherein the substrate 201 is not shown. The U-shape through-hole via inductor 250 is made of the first through-hole via inductor 202A, the second through-hole via inductor 202B and the horizontal inductor 221. In one embodiment, the first through-hole via inductor 202A has a first integral body and the second through-hole via inductor 202B has a second integral body. The equivalent circuit 220 of the U-shape through-hole via inductor 250 is illustrated in FIG. 3C. In one embodiment of the structure 200, the resultant inductance of the first through-hole via inductor 202A and the second through-hole via inductor 202B is greater than the inductance of that horizontal inductor 221. In one embodiment of the structure 200, the resultant inductance of the first through-hole via inductor 202A, the second through-hole via inductor 202B and the horizontal inductor 221 is substantially equal to the resultant inductance of the first through-hole via inductor 202A and the second through-hole via inductor 202B. The structure 200 can be applied to some high-frequency devices, such as a high-frequency filter. Two terminals 222, 223 of the U-shape through-hole via inductor 250 can be electrically connected to any other conductive element. In one example, one terminal 222 can be electrically connected to a capacitor and the other terminal 223 can be electrically connected to an inductor. In another example, one terminal 222 can be electrically connected to a capacitor and the other terminal 223 can be electrically connected to ground. In yet another example, one terminal 222 can be electrically connected to one terminal of a capacitor and the other terminal 223 can be electrically connected to the other terminal of a capacitor. The way to electrically connect any other conductive element can be well designed, and the design layout can be easily modified by skilled persons in the art so that it can't be described in detail herein. According, it can not only shrink the size of the high-frequency device but also improve the electrical performance of the high-frequency device.

The substrate 201 can be made of any suitable material, such as a dielectric substrate or a ceramic substrate (e.g. aluminum-oxide ($Al_2O_3$) substrate). The first through-hole via inductor 202A and the second through-hole via inductor 202B can be made of any suitable material, such as Cu, Ag or a combination thereof. Preferably, the height of each of the first through-hole via inductor 202A and the second through-hole via inductor 202B is about 320 µm, and the diameter of each of the first through-hole via inductor 202A and the second through-hole via inductor 202B is about 100 µm. The above characteristics described in FIG. 2A to FIG. 2F can be applied to the structure 200 in FIG. 3A.

In the preferred embodiment of the present invention, the structure of the high-frequency device, such as a high-frequency filter, is provided. The structure includes a capacitor and a portion of an inductor disposed on opposite surfaces of the substrate.

Figure 4A:
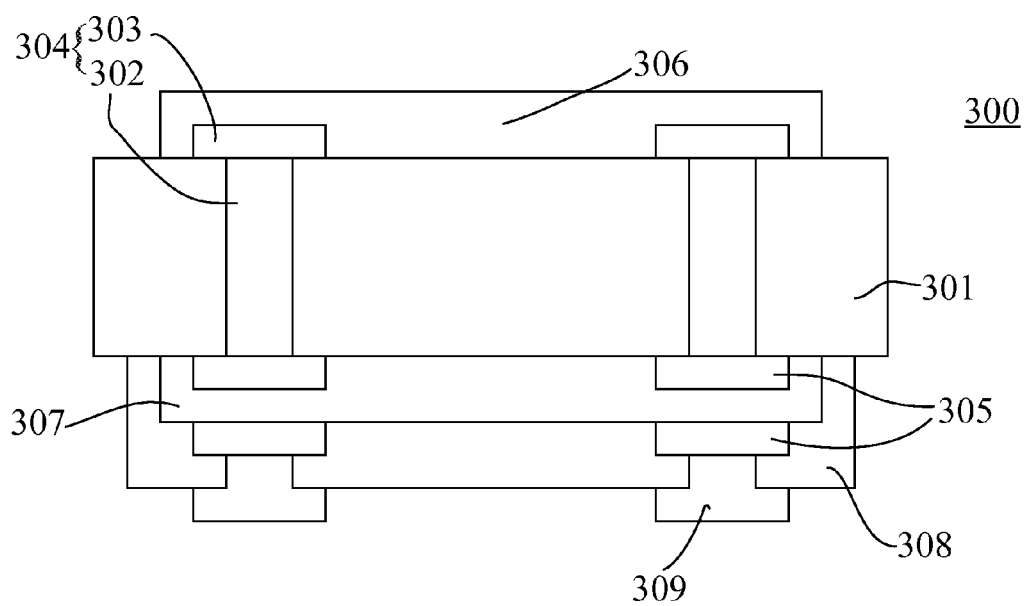
FIG. 4A illustrates a schematic cross-sectional view of the structure of the high-frequency device.

Please refer to FIG. 4A, the structure 300 of the high-frequency device includes a substrate 301, an inductor 304, a capacitor 305, a dielectric layer 307, a first passivation layer 306, a second passivation layer 308 and a contact pad 309. The structure 300 of the high-frequency device mainly includes a capacitor 305 and a portion of an inductor 304 disposed on opposite surfaces of the substrate 301. In particular, the structure 300 of the high-frequency device is mainly made of three parts: a horizontal inductor 303, a through-hole via inductor 302 and a horizontal capacitor (a capacitor) 305, wherein the inductor 304 comprises a horizontal inductor 303 and a through-hole via inductor 302. In one embodiment, the through-hole via inductor 302 has an integral body. In one embodiment, the inductance of the through-hole via inductor 302 is greater than that of that horizontal inductor 303. In one embodiment, the resultant inductance of the through-hole via inductor 302 and the horizontal inductor 303 is substantially equal to the inductance of the through-hole via inductor 302. The above characteristics described in FIG. 2A to FIG. 2F can be also applied to the structure 300 in FIG. 4A. Besides, the U-shape through-hole via inductor 250 previously described in FIG. 3A to FIG. 3C can be also applied to the structure 300 in FIG. 4A.

The substrate 301 can be made of any suitable material, such as a dielectric substrate or a ceramic substrate (e.g. aluminum-oxide ($Al_2O_3$) substrate). The inductor 304 can be made of any suitable material, such as Cu, Ag or a combination thereof. Preferably, the height of the through-hole via inductor 302 is about 320 µm and the width in diameter of the through-hole via inductor 302 is about 100 µm. A dielectric layer 307 is disposed between two electrodes of the horizontal capacitor 305. The first passivation layer 306 overlays a horizontal inductor 303 (a portion of the inductor 304), and the second passivation layer 308 overlays the horizontal capacitor 305. A contact pad 309, which is disposed on the horizontal capacitor 305 and electrically connected to the horizontal capacitor 305, is used as an I/O terminal of the structure 300 of the high-frequency device.

In an preferred embodiment in the present invention, the structure 300 of the high-frequency device has a capacitor 305 and a portion of an inductor 304 disposed on opposite surfaces of the substrate 301, wherein the inductor 304 comprises a plurality of U-shape through-hole via inductors 250 which are all connected to the single capacitor 305 disposed on the bottom surface of the substrate 301. Accordingly, it can improve the electrical performance of the high-frequency device.

Take "two U-shape through-hole via inductors 250 which are all connected to the single capacitor 305 disposed on the bottom surface of the substrate 301" for example. The structure of the high-frequency device comprises: (a) a substrate having a first through-hole, a second through-hole, a third through-hole and a fourth through-hole therein; (b) a first U-shape through-hole via inductor comprising: a first through-hole via inductor, disposed in the first through-hole of the substrate; a second through-hole via inductor, disposed in the second through-hole of the substrate; and a first horizontal inductor disposed on the top surface of the substrate, wherein the first horizontal inductor has a first terminal and a second terminal, wherein the first terminal is electrical connected to the first through-hole via inductor, and the second terminal is electrical connected to the second through-hole via inductor; (c) a second U-shape through-hole via inductor comprising: a third through-hole via inductor, disposed in the third through-hole of the substrate; a fourth through-hole via inductor, disposed in the fourth through-hole of the substrate; and a second horizontal inductor disposed on the top surface of the substrate, wherein the second horizontal inductor has a third terminal and a fourth terminal, wherein the third terminal is electrical connected to the third through-hole via inductor, and the fourth terminal is electrical connected to the fourth through-hole via inductor; (d) a horizontal capacitor on the bottom surface of the substrate, wherein the first through-hole via inductor, the second through-hole via inductor, the third through-hole via inductor and the fourth through-hole via inductor are all electrically connected to the horizontal capacitor. In one embodiment, the first through-hole via inductor has a first integral body, the second through-hole via inductor has a second integral body, the third through-hole via inductor has a third integral body, and the fourth through-hole via inductor has a fourth integral body.

Figure 4B:
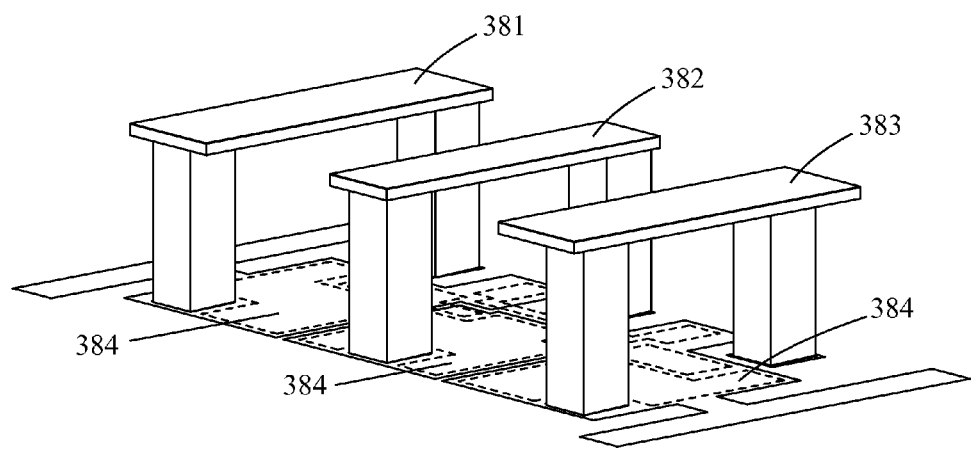
FIG. 4B and FIG. 4C illustrates a three-dimensional perspective view of the structure comprising a first U-shape through-hole via inductor, a second U-shape through-hole via inductor, a third U-shape through-hole via inductor and a pattern layout.
Figure 4C:
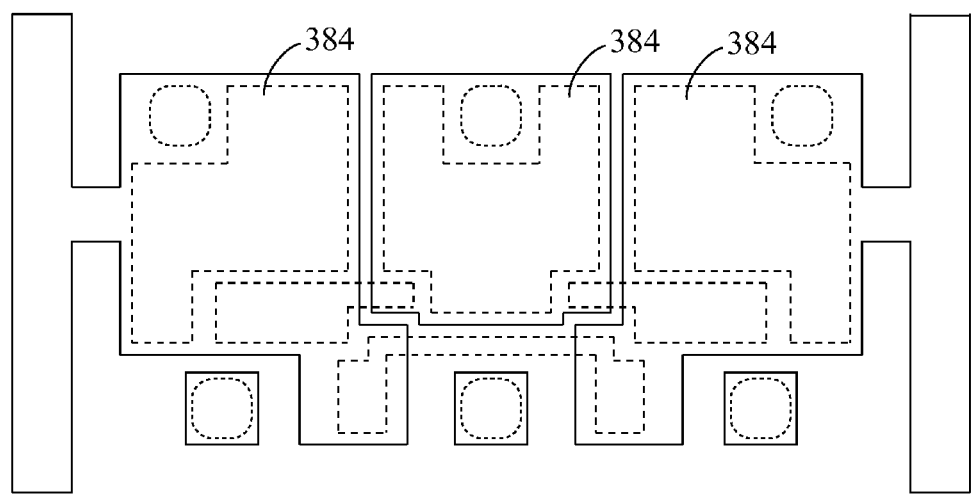

FIG. 4B and FIG. 4C illustrates a three-dimensional perspective view of the structure comprising a first U-shape through-hole via inductor 381, a second U-shape through-hole via inductor 382, a third U-shape through-hole via inductor 383 and a pattern layout 384. The first U-shape through-hole via inductor 381, the second U-shape through-hole via inductor 382, and the third U-shape through-hole via inductor 383 are electrically connected to the pattern layout 384 therebelow. The pattern layout 384 can comprise at least one of an inductor, a capacitor or a ground terminal.

Figure 5A:
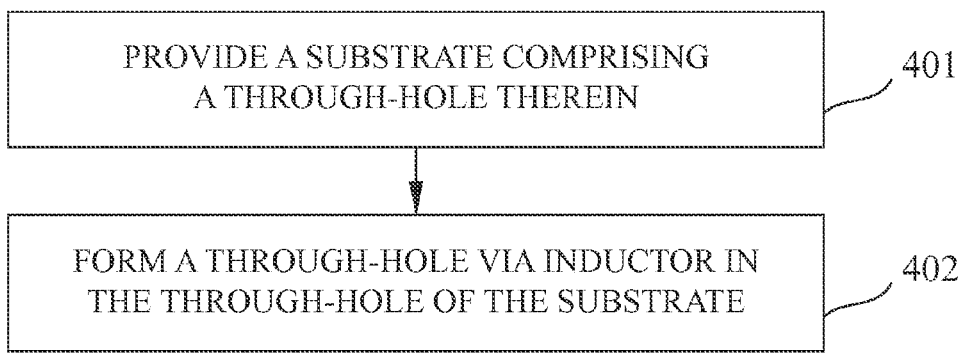
FIG. 5A illustrates the process flow of manufacturing the structure of the through-hole via inductor in FIG. 2A.

FIG. 5A illustrates the process flow of manufacturing the structure 100 of the through-hole via inductor 102 in FIG. 2A. The process flow comprises two main steps: provide a substrate comprising a through-hole therein (step 401); and form a through-hole via inductor in the through-hole of the substrate (step 402).

Figure 5B:
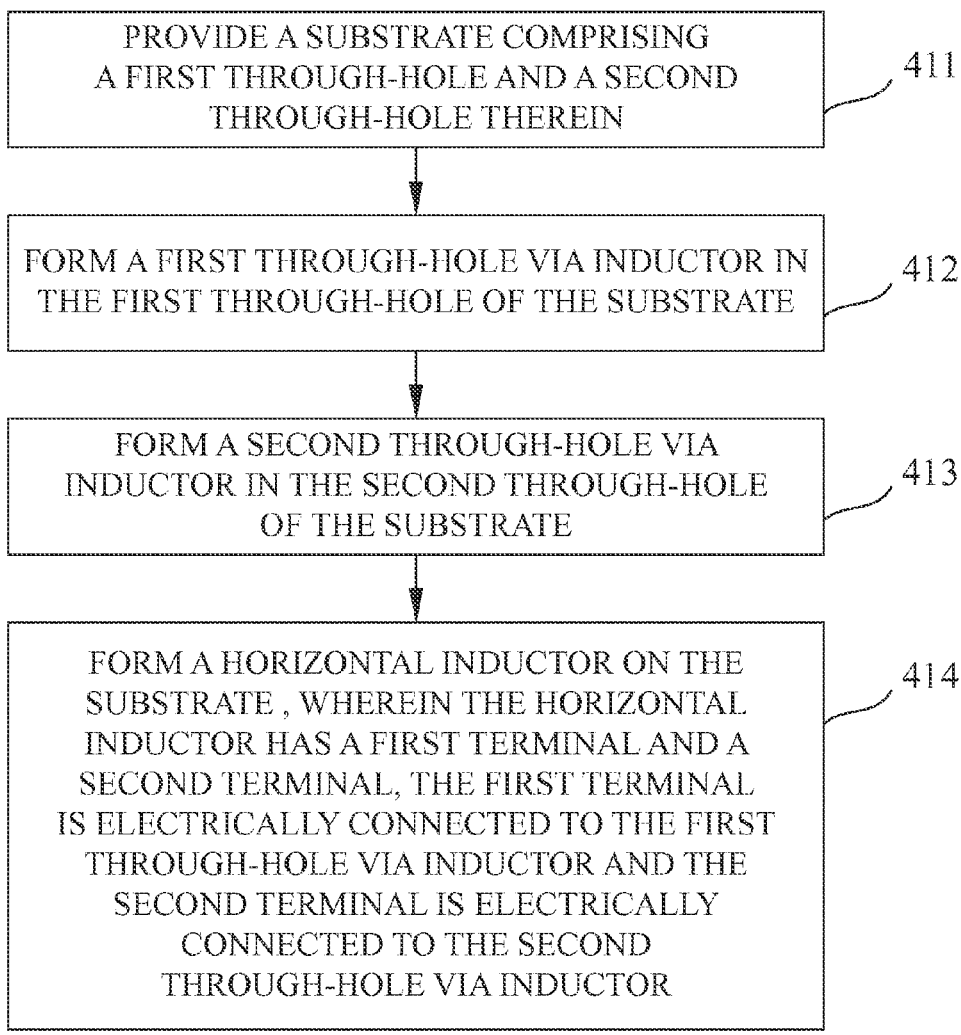
FIG. 5B illustrates the process flow of manufacturing the structure of the U-shape through-hole via inductor in FIG. 3A.

FIG. 5B illustrates the process flow of manufacturing the structure 200 of the U-shape through-hole via inductor in FIG. 3A. The process flow comprises four main steps: provide a substrate comprising a first through-hole and a second through-hole therein (step 411); form a first through-hole via inductor in the first through-hole of the substrate (step 412); form a second through-hole via inductor in the second through-hole of the substrate (step 413); and form a horizontal inductor on the substrate (step 414), wherein the horizontal inductor has a first terminal and a second terminal, the first terminal is electrically connected to the first through-hole via inductor and the second terminal is electrically connected to the second through-hole via inductor.

Figure 5C:
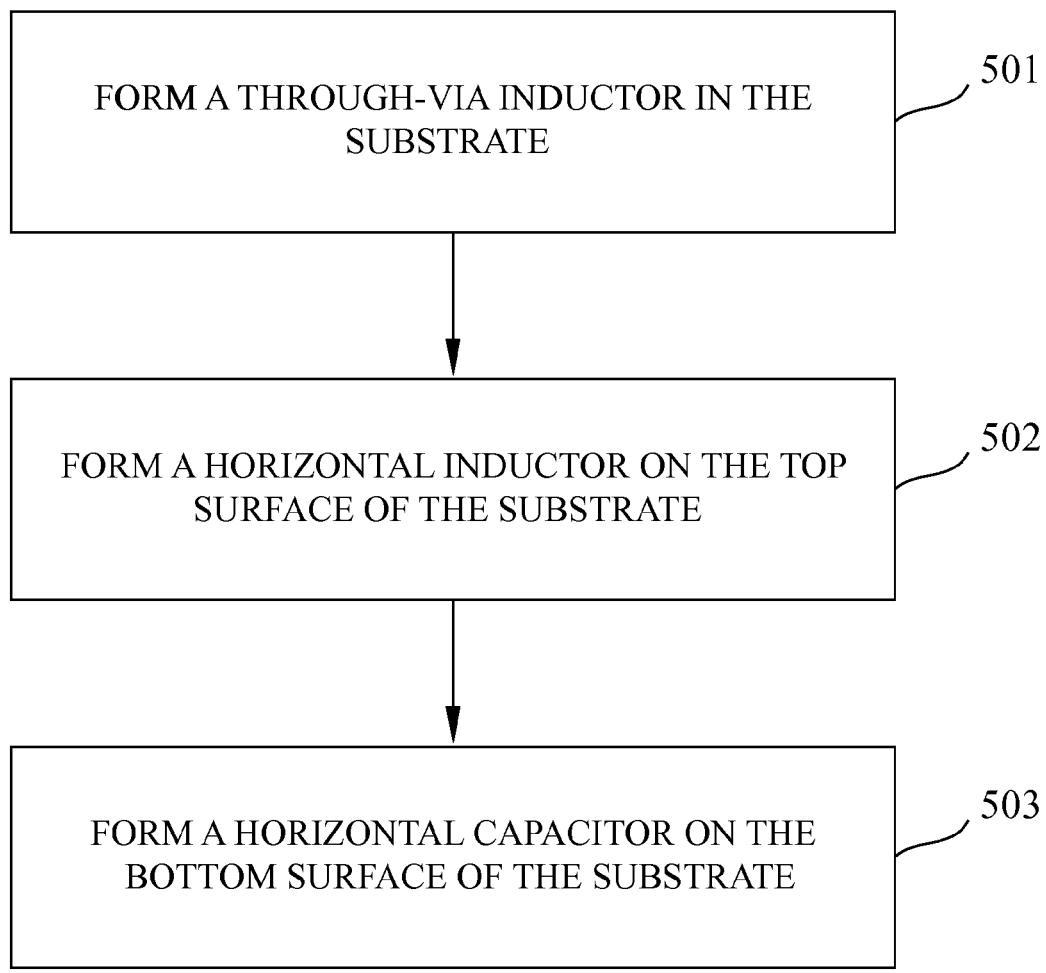
FIG. 5C illustrates the process flow of manufacturing the structure of the high-frequency device in FIG. 4A.

FIG. 5C illustrates the process flow of manufacturing the structure 300 of the high-frequency device in FIG. 4A. The process flow comprises three main steps: form a through-hole via inductor in the substrate (step 501); form a horizontal inductor on the top surface of the substrate (step 502); and form a horizontal capacitor on the bottom surface of the substrate (step 503). The order of step 502 and step 503 can be changed. In one embodiment, the step 501 and step 502 can be combined in a single step "form an inductor 304 in the substrate 301" or "form a U-shape through-hole via inductor 250 in the substrate 301".

Embodiment 1 discloses a method of manufacturing the structure 300 of the high-frequency device in FIG. 4A.

FIG. 6A to FIG. 6J illustrates the process flow of manufacturing the structure 300 of the high-frequency device in FIG. 4A.

The present invention disclose a method for manufacturing the structure 300 of the high-frequency device, wherein the method mainly includes via-drilling and via-filling in the substrate, and lithography process on the substrate.

Figure 6A:
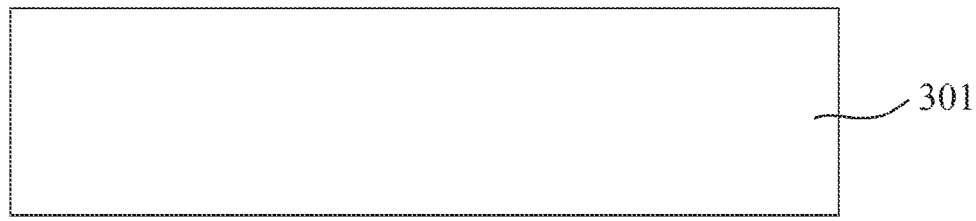
FIG. 6A to FIG. 6J illustrates the process flow of manufacturing the structure 300 of the high-frequency device in FIG. 4A in detail.
Figure 6B:
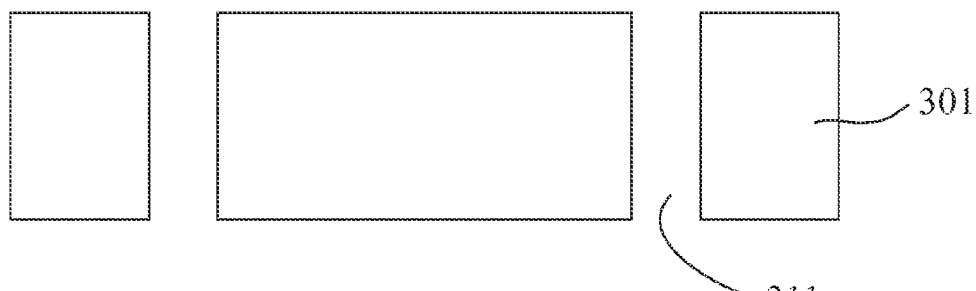
Figure 6C:
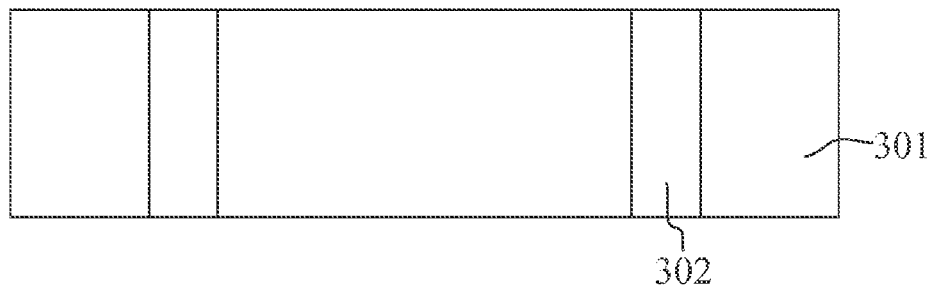

FIG. 6A to FIG. 6C describes the step 501 "form a through-hole via inductor 302 in the substrate 301" in FIG. 5C in detail.

As illustrated in FIG. 6A, provide a substrate 301. The substrate 301 has a top surface and a bottom surface. The substrate 301 can be made of any suitable material, such as a dielectric substrate or a ceramic substrate (e.g. aluminum-oxide ($Al_2O_3$) substrate). Before forming a through-hole via 311 in the substrate 301, the substrate 301 can be sintered. The thickness of the substrate 301 is 100~500 μm, preferably about 320 μm.

As illustrated in FIG. 6B, form a through-hole via 311 in the substrate 301. The through-hole via 311 can be formed by known techniques, such as drilling, mechanical through-hole or laser through-hole.

As illustrated in FIG. 6C, fill the through-hole via 311 with a conductive material to form a through-hole via inductor 302. The through-hole via inductor 302 can be made of any suitable material, such as Cu, Ag or a combination thereof, to reduce its resistance. Preferably, the height of the through-hole via inductor 302 is about 320 μm and the width in diameter of the through-hole via inductor 302 is about 100 μm.

The through-hole via inductor 302 can comprise at least two materials which are well designed in the through-hole via inductor 302 to achieve the better electrical characteristics, wherein one of said at least two materials is a conductive material. In one embodiment, the through-hole via inductor 302 can be made of at least two conductive materials. Please refer back to FIG. 2C and FIG. 2D, the through-hole via inductor 302 can be made of a first conductive material overlaying the sidewall of the through-hole via and a second conductive material enclosed by the first conductive material. The first conductive material can overlay the sidewall of the through-hole via by electroplating or any suitable coating process. Preferably, the first conductive material can be made of Cu and the second conductive material can be made of Ag. In another embodiment, the through-hole via inductor 302 can comprise a conductive material and a non-conductive material enclosed by the conductive material (refer back to FIG. 2E and FIG. 2F). Accordingly, it can greatly improve the electrical performance of the high-frequency device.

Figure 6D:
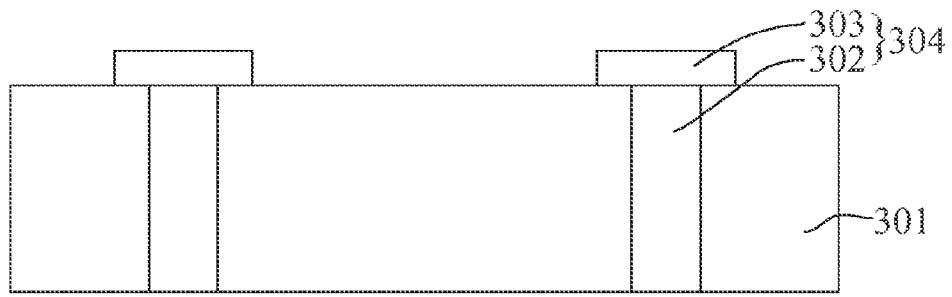

FIG. 6D describes the step 502 "form a horizontal inductor 303 on the top surface of the substrate 301" in FIG. 5C in detail.

As illustrated in FIG. 6D, form a first patterned conductive layer 303 on the top surface of the substrate 301 to form a horizontal inductor 303. The horizontal inductor 303 is electrically connected to the through-hole via inductor 302. The first patterned conductive layer 303 can be patterned by lithography process or printing process. The first patterned conductive layer 303 can be made of any suitable material, such as Cu, Ag or a combination thereof, to reduce its resistance. In one embodiment, the step 501 and step 502 can be combined in a single step "form an inductor 304 in the substrate 301" or "form a U-shape through-hole via inductor 250 in the substrate 301".

Figure 6E:
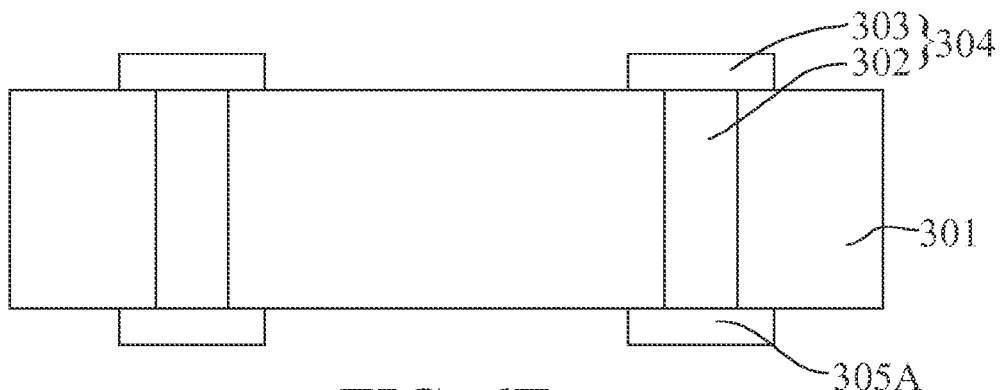
Figure 6F:
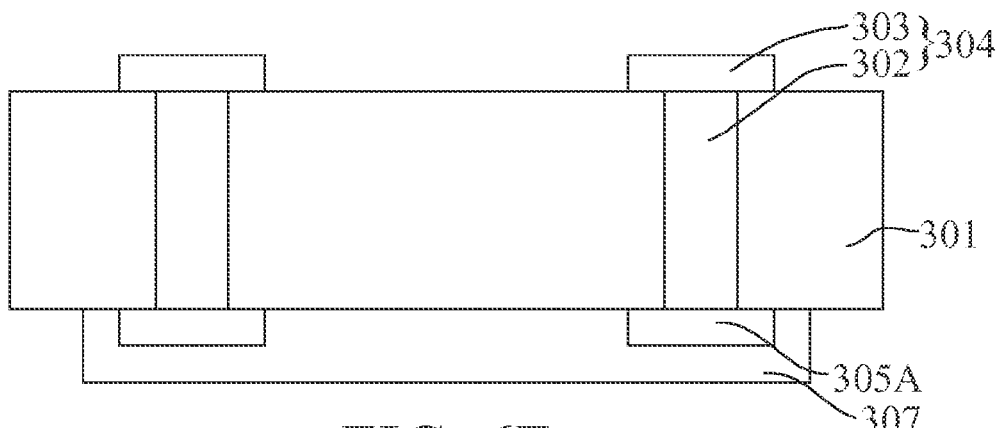
Figure 6G:
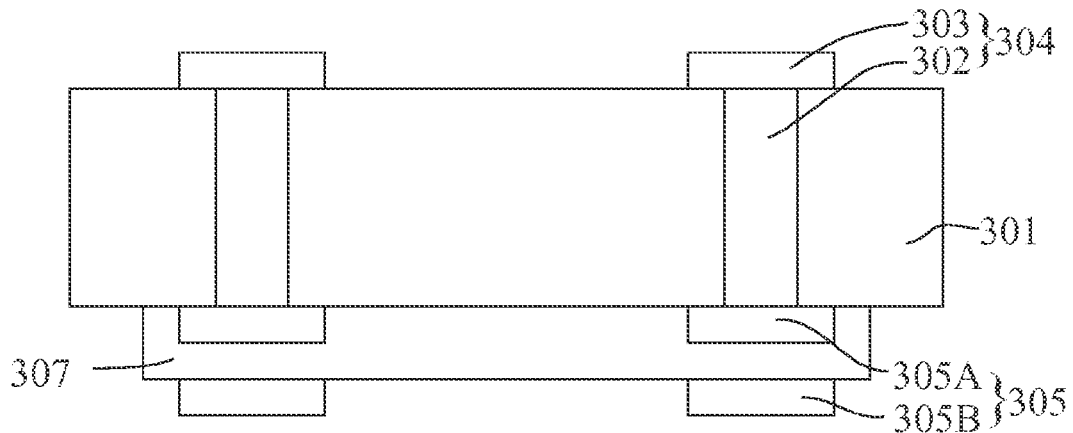

FIG. 6E to FIG. 6G describes the step 503 "form a horizontal capacitor 305 on the bottom surface of the substrate 301" in FIG. 5C in detail.

As illustrated in FIG. 6E, form a second patterned conductive layer 305A on the bottom surface of the substrate 301. The second patterned conductive layer 305A can be patterned by lithography process or printing process. The second patterned conductive layer 305A can be made of any suitable material, such as Cu, Ag or a combination thereof.

As illustrated in FIG. 6F, form a dielectric layer 307 to overlay the second patterned conductive layer 305A. The dielectric layer 307 can be formed by chemical vapor deposition (CVD). The dielectric layer 307 can be made of any suitable material with high dielectric constant and high-quality factor.

As illustrated in FIG. 6G, form a third patterned conductive layer 305B on the dielectric layer 307 to form a horizontal capacitor 305 on the bottom surface of the substrate 301. The second patterned conductive layer 305A is used as one electrode of the horizontal capacitor 305; the third patterned conductive layer 305B is used as the other electrode of the horizontal capacitor 305. The dielectric layer 307 is between two electrodes of the horizontal capacitor 305. The third patterned conductive layer 305B can be patterned by lithography process or printing process. The third patterned conductive layer 305B can be made of any suitable material, such as Cu, Ag or a combination thereof.

Figure 6H:
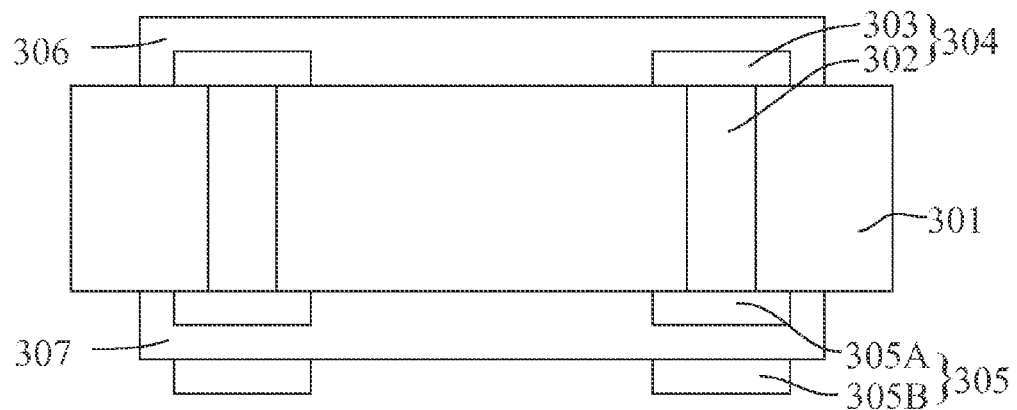

As illustrated in FIG. 6H, form a first passivation layer 306 to overlay the horizontal inductor 303. The first passivation layer 306 protects the horizontal inductor 303 from external interference.

Figure 6I:
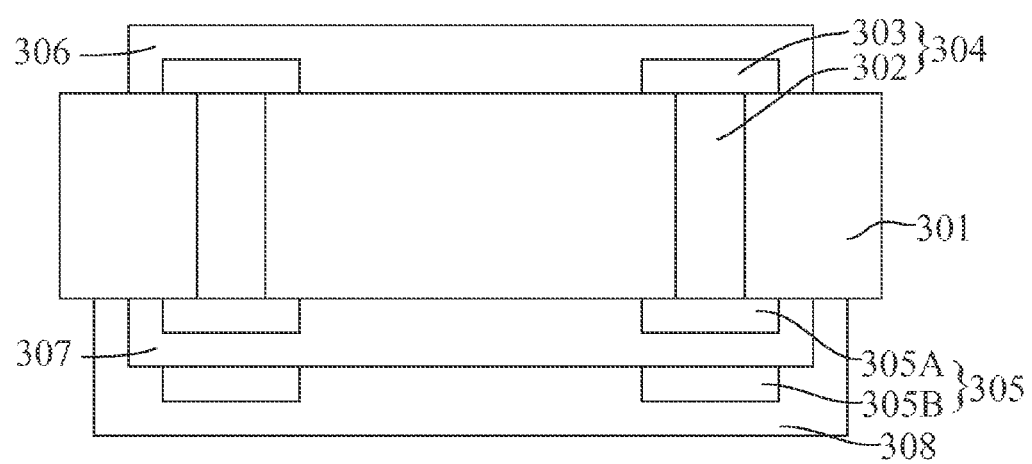

As illustrated in FIG. 6I, form a second passivation layer 308 to overlay the horizontal capacitor 305. The second passivation layer 308 protects the horizontal capacitor 305 from external interference.

Figure 6J:
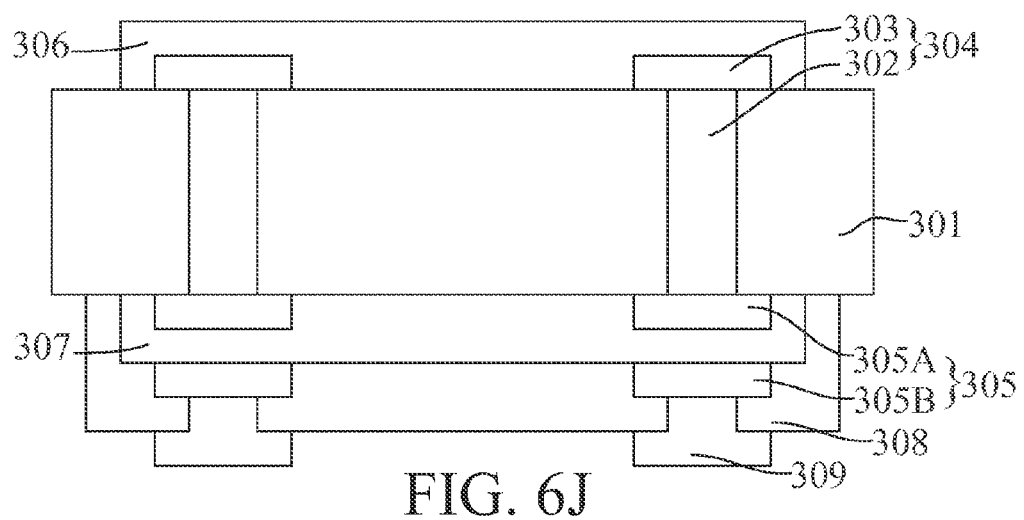

As illustrated in FIG. 6J, form a contact pad 309 on the second passivation layer 308 to electrically connect the horizontal capacitor 305. The contact pad 309 can be formed by lithography process or printing process.

Embodiment 2 discloses another method of manufacturing the structure 300 of the high-frequency device in FIG. 4A.

Please refer back to FIG. 5C. The present invention discloses another method for manufacturing the structure 300 of the high-frequency device, wherein the method mainly includes a multi-sheet substrate and lithography process on the multi-sheet substrate.

The method comprises three main steps: form a vertical inductor 302 in the substrate 301 (step 501); form a horizontal inductor 303 on the top surface of the substrate 301 (step 502); and form a horizontal capacitor 305 on the bottom surface of the substrate 301 (step 503). The order of step 502 and step 503 can be changed. In one embodiment, the step 501 and step 502 can be combined in a single step "forms an inductor 304 in the substrate 301" or "form a U-shape through-hole via inductor 250 in the substrate 301".

In step 501, form a vertical inductor 302 in the substrate 301. A sheet is formed by green of the ceramic material or green of the polymer material. The ceramic material or the polymer material can have a thickness of about 50~500 μm. Then, form a through-via in the sheet by known techniques, such as drilling, mechanical through-hole or laser through-hole, and fill the through-via in the sheet with a conductive material. So a sheet with of thickness of 150~400 μm is formed. A plurality of sheets can be stacked to form a substrate 301 by known process, such as LTCC (low-temperature co-fired ceramics). Then, perform sintering or curing to form a vertical inductor 302 in the substrate 301.

In step 502, form a horizontal inductor 303 on the top surface of the substrate 301. The horizontal inductor 303 can be formed by lithography process or printing process.

In step 503, form a horizontal capacitor 305 on the bottom surface of the substrate 301. The horizontal capacitor 305 is made by the combination of the electrodes and the dielectric layer which has a high dielectric constant and high-quality green. The green can be the mixture of the microwave-dielectric ceramic powders and an organic carrier. The organic carrier can be thermoplastic polymer, thermosetting polymer, plasticizer and organic solvent etc.

The steps of forming the green comprises mixing the microwave-dielectric ceramic powder with the organic vehicle and adjusting the mixture until the mixture has a suitable viscosity, degas, remove bubble, and tape casting. The green is adhered on the substrate 301 having the vertical inductor by pressing. After curing, form a horizontal capacitor 305 on the bottom surface of the substrate 301.

The steps or characteristics of FIG. 6H to FIG. 6J described in embodiment 1 can be applied to the embodiment 2 as well; therefore the details are not described herein.

Figure 7A:
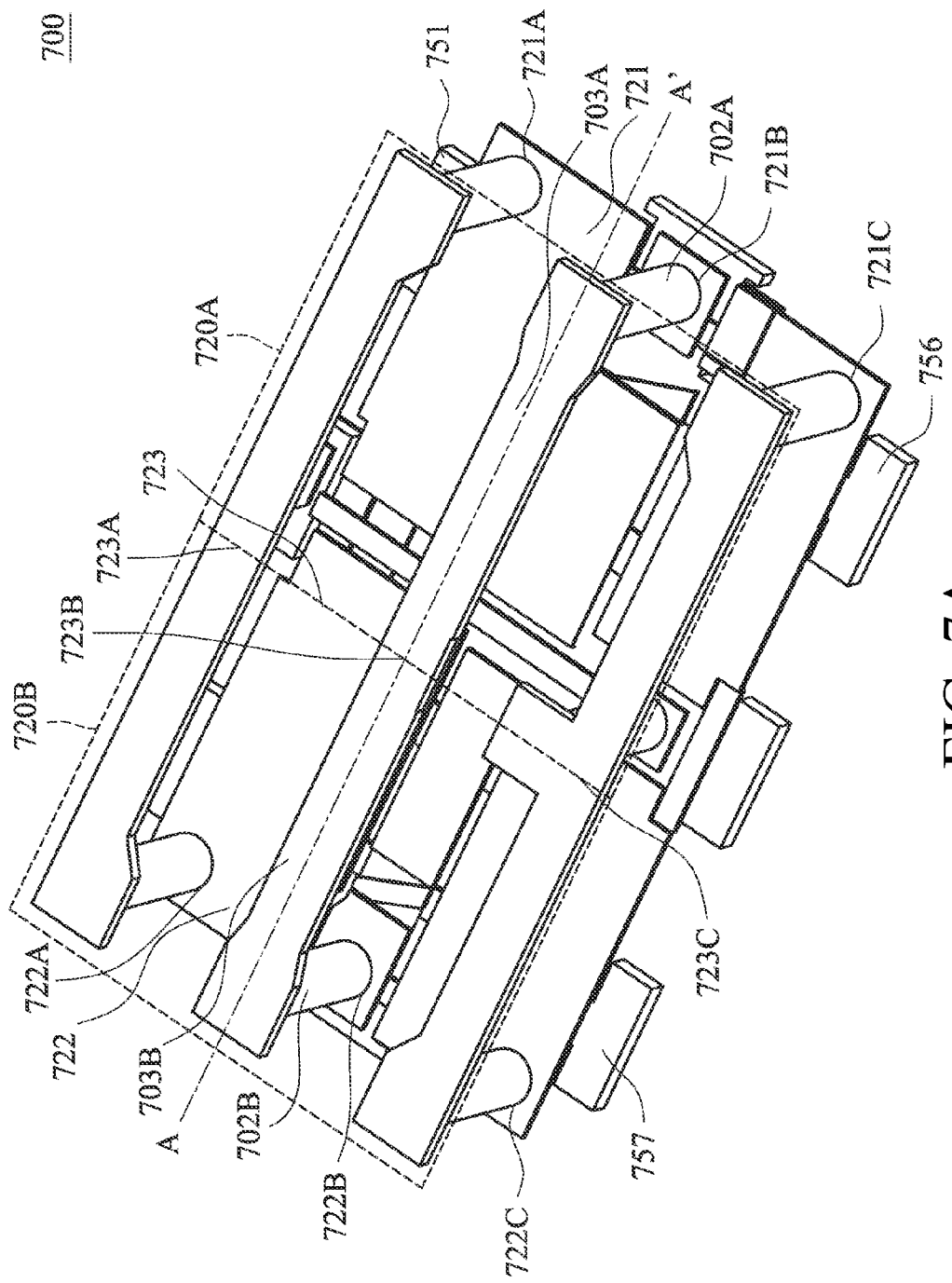
FIG. 7A illustrates a three-dimensional perspective view of the balance filter in the present invention, wherein the substrate, the first passivation layer and the second passivation layer are not shown.
Figure 7B:
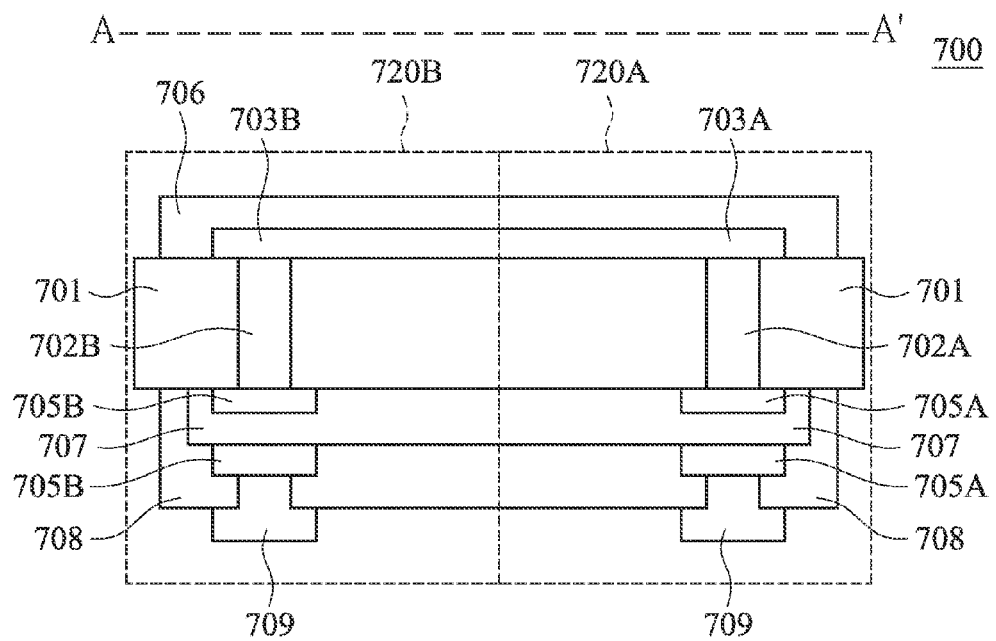
FIG. 7B illustrates a schematic cross-sectional view of the balance filter in the present invention.
Figure 7C:
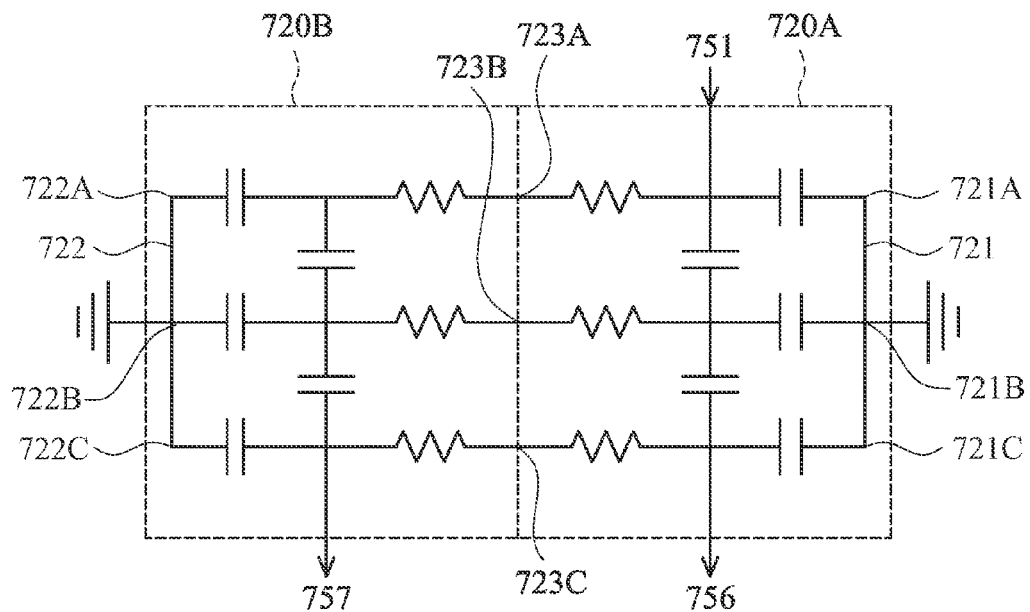
FIG. 7C illustrates a symmetric circuit in one embodiment of the present invention.

Additionally, in one embodiment of the present invention, a balance filter is formed by combining a first circuit and a second circuit to optimize the performance of the balance filter. FIG. 7A illustrates a three-dimensional perspective view of the balance filter 700 in the present invention, wherein the substrate 701, the first passivation layer 706 and the second passivation layer 708 are not shown. FIG. 7B illustrates a schematic cross-sectional view of the balance filter 700 in the present invention. In reference to both FIG. 7A and FIG. 7B together, sections A-A' in FIG. 7B are taken along lines A-A' shown in FIG. 7A. The first circuit 720A and the second circuit 720B are designed in the same substrate 701. Each of the first circuit 720A and the second circuit 720B can have any suitable circuit configuration. Preferably, the first circuit 720A is electrically symmetric to the second circuit 720B (see FIG. 7C which illustrates a symmetric circuit in one embodiment of the present invention). However, the present invention is not limited to this arrangement in FIG. 7A, FIG. 7B and FIG. 7C.

The ground configuration can be well designed by a designer. In one embodiment, please continuously refer to FIG. 7A and FIG. 7C, a first portion 721A, a second portion 721B and a third portion 721C on a first side 721 of the first circuit 720A are grounded, and a fourth portion 722A, a fifth portion 722B and a sixth portion 722C on a second side 722 of the second circuit 720B, opposite to the first side 721 of the first circuit 720A, are grounded. In another embodiment, at least one of the contact points connecting the first circuit 720A and the second circuit 720B is virtually grounded so that less vias are formed in the substrate 701 to reduce the manufacturing cost. For example, a first contact point 723A, a second contact point 723B and a third contact point 723C in the boundary 723 between the first circuit 720A and the second circuit 720B are virtually grounded.

The substrate 701 can be made of any suitable material, such as a dielectric substrate or a ceramic substrate (e.g. aluminum-oxide ($Al_2O_3$) substrate). The thickness of the substrate 701 is 100~500 μm, preferably about 320 μm. The first circuit 720A comprises a first through-hole via inductor 702A substantially disposed in the first through-hole of the substrate 701, and the second circuit 720B comprises a second through-hole via inductor 702B substantially disposed in the second through-hole of the substrate 701. Optionally, the first circuit 720A comprises a plurality of first through-hole via inductors 702A substantially disposed in the first through-holes of the substrate 701, or the second circuit 720B comprises a plurality of second through-hole via inductors 702B substantially disposed in the second through-holes of the substrate 701. In one embodiment, each of the first through-hole via inductor 702A and the second through-hole via inductor 702B includes at least two materials which are well designed to achieve the above electrical characteristics, wherein one of said at least two materials is a conductive material, such as Cu, Ag or a combination thereof (see FIG. 2E and FIG. 2F). The through-hole via inductor has been described in the structure in FIG. 2A to FIG. 2F. The first through-hole via inductor 702A and the second through-hole via inductor 702B can be formed in the substrate 701 at the same time by any suitable process, such as via-drilling, via-filling in the substrate or lithography process.

Figure 7D:
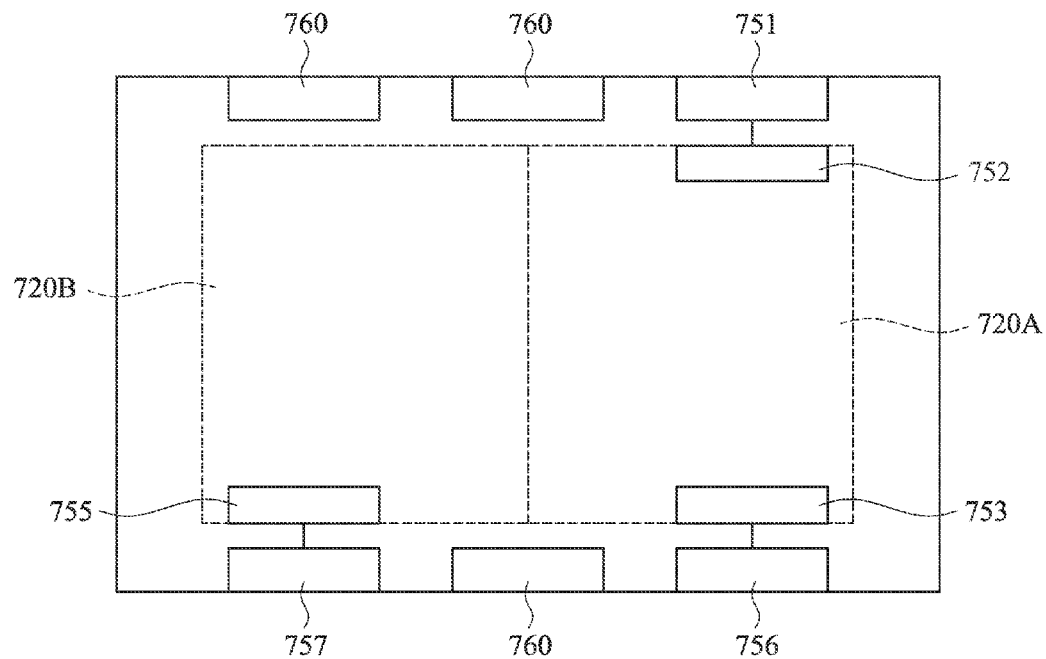
FIG. 7D illustrates a schematic diagram of the first circuit and the second circuit designed in the balance filter.

FIG. 7D illustrates a schematic diagram of the first circuit 720A and the second circuit 720B designed in the balance filter 700. The balance filter 700 has an input terminal 751 to receive an input signal. The first circuit 720A has a first terminal 752 electrically connected to the input terminal 751 and a second terminal 753 to generate a first output signal; the second circuit 720B is electrically connected to the first circuit 720A and has a third terminal 755 to generate a second output signal. The balance filter 700 has a first output terminal 756 electrically connected to the second terminal 753 of the first circuit 720A to output the first output signal and a second output terminal 757 electrically connected to the third terminal 755 of the second circuit 720B to output the second output signal. The first output signal and the second output signal can have substantially equal amplitude and 180 degree phase difference.

More specifically, please refer again to FIG. 7A and FIG. 7B, the first circuit 720A comprises a first through-hole via inductor 702A substantially disposed in the first through-hole of the substrate 701. One terminal of the first through-hole via inductor 702A is electrically connected to a first horizontal inductor 703A disposed on the top surface of the substrate 701, and the other terminal of the first through-hole via inductor 702A is electrically connected to a first horizontal capacitor 705A disposed on the bottom surface of the substrate 701; the second circuit 720B comprises a second through-hole via inductor 702B substantially disposed in the second through-hole of the substrate 701. One terminal of the second through-hole via inductor 702B is electrically connected to a second horizontal inductor 703B disposed on the top surface of the substrate 701, and the other terminal of the second through-hole via inductor 702B is electrically connected to a second horizontal capacitor 705B disposed on the bottom surface of the substrate 701.

In one embodiment, please continuously see FIG. 7A, the balance filter 700 further comprises a power trace 750 disposed between the first circuit 720A and the second circuit 720B (described in detail FIG. 8B) and electrically connected to an IC (not shown).

The inductance of the first through-hole via inductor 702A is greater than that of the first horizontal inductor 703A, and the inductance of the second through-hole via inductor 702B is greater than that of the second horizontal inductor 703B. In one embodiment, the resultant inductance of the first through-hole via inductor 702A and the first horizontal inductor 703A is substantially equal to the inductance of the first through-hole via inductor 702A, and the resultant inductance of the second through-hole via inductor 702B and the second first horizontal inductor 703B is substantially equal to the inductance of the second through-hole via inductor 702B. In one embodiment, the resultant inductance of the first through-hole via inductor 702A and the second horizontal inductor 703B is greater than that the first horizontal inductor 703A and the second first horizontal inductor 703B. In one embodiment, a parasitic capacitance in the interior of the balance filter 700 can be used as the first horizontal capacitor 705A or the second horizontal capacitor 705B so that the process cost is reduced. A dielectric layer 707 is disposed between two electrodes of the first horizontal capacitor 705A and between two electrodes of the second horizontal capacitor 705B. The first passivation layer 706 overlays the first horizontal inductor 703A and the second horizontal inductor 703B, and the second passivation layer 708 overlays the first horizontal capacitor 705A and the second horizontal capacitor 705B. A plurality of contact pads 709 are disposed on the first horizontal capacitor 705A and the second horizontal capacitor 705B.

Each of the first circuit 720A and the second circuit 720B can comprise at least one U-shape through-hole via inductor. The U-shape through-hole via inductor has been described in the structure in FIG. 3A to FIG. 3C such that it doesn't be repeated herein. In a preferred embodiment, each of the first circuit 720A and the second circuit 720B has a capacitor and a portion of an inductor disposed on opposite surfaces of the substrate 701, wherein each of the first circuit 720A and the second circuit 720B comprises at least one U-shape through-hole via inductor which is all connected to a single capacitor disposed on the bottom surface of the substrate 701.

Figure 7E:
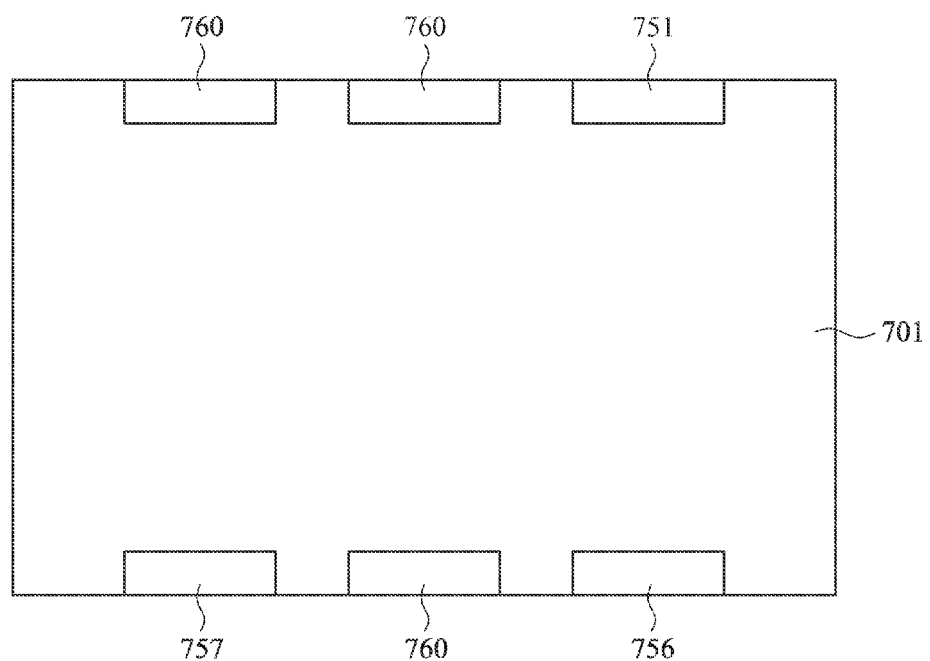
FIG. 7E illustrates a bottom view of the balance filter in the present invention.

FIG. 7E illustrates a bottom view of the balance filter 700 in the present invention. The input terminal 751, the first output terminal 756, the second output terminal 757 and three ground terminals 760 can be disposed on the bottom surface of the substrate 701. However, the present invention is not limited to this arrangement.

Figure 8A:
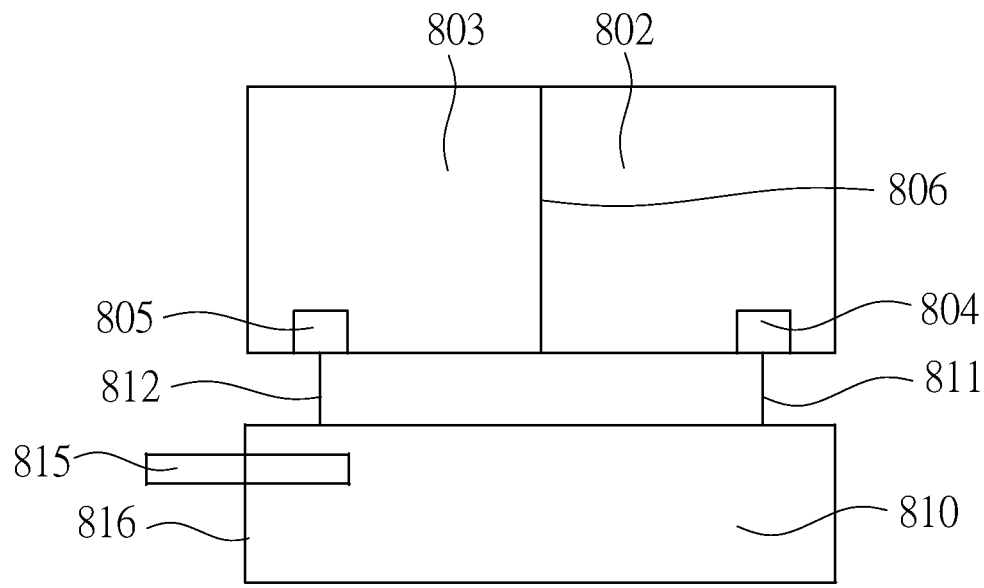
FIG. 8A illustrates a conventional layout structure.
Figure 8B:
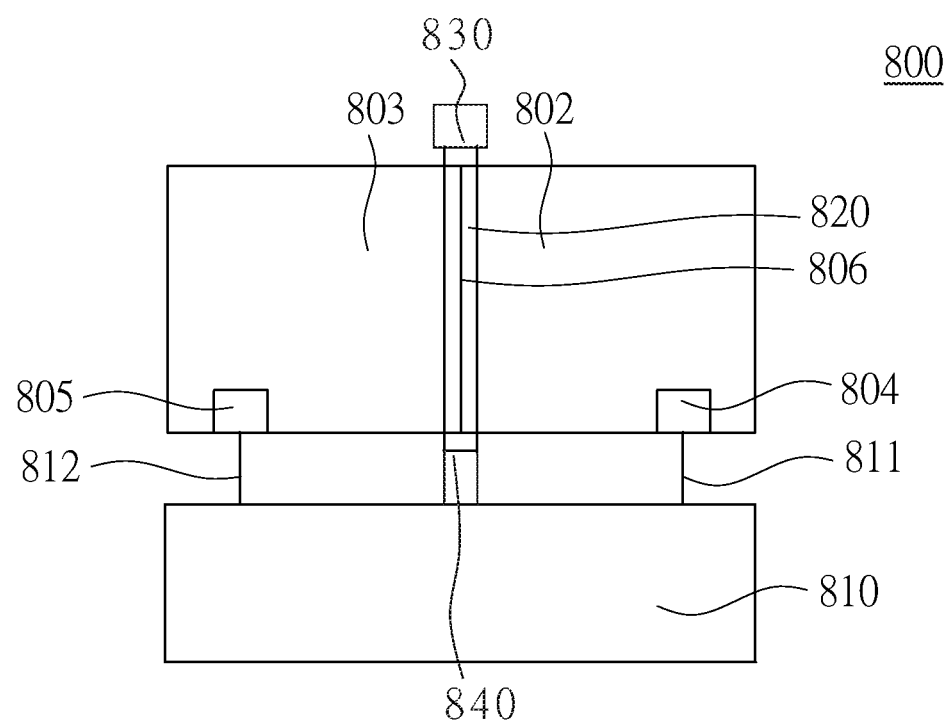
FIG. 8B illustrates a layout structure in the present invention.

Please refer to FIG. 8A, the layout structure mainly comprises an IC 810, a first layout of a first circuit 802, a second layout of a second circuit 803. The first layout of the first circuit 802 has a first terminal 804 electrically connected to the IC 810. The second layout of the second circuit 803 has a second terminal 805 electrically connected to the IC 810. The first layout 802 is electrically connected to the second layout 803. Conventionally, when a power trace 815 is disposed on the edge 816 of the IC 810, there will be an impedance inconsistency between the first conductive wire 811 and the second conductive wire 812 because the distance between the power trace 815 and the first conductive wire 811 is different from the distance between the power trace 815 and the second conductive wire 812.

The present invention discloses a layout structure 800 to solve the abovementioned problem. Please refer to FIG. 8B, the layout structure 800 mainly comprises an IC 810, a first layout of a first circuit 802, a second layout of a second circuit 803. The first layout of the first circuit 802 and the second layout of the second circuit 803 can be in the periphery of the IC 810. The first layout of the first circuit 802 has a first terminal 804 electrically connected to the IC 810. The second layout of the second circuit 803 has a second terminal 805 electrically connected to the IC 810. The first layout 802 is electrically connected to the second layout 803. Preferably, the second layout 803 is electrically symmetric to the first layout 802 (see FIG. 7A and FIG. 7C). A first trace 820 is disposed between the first layout 802 and the second layout 803. Preferably, the first trace 820 is disposed in the boundary 806 between the first layout 802 and the second layout 803. One end of the first trace 820 is electrically connected to a power supply 830 and the other end of the first trace 820 is electrically connected to the IC 810 by an extension part 840 of the first trace 820. The power supply can be a DC type. In one embodiment, the first circuit and the second circuit form a balance filter (see FIG. 7A to FIG. 7E). The first terminal 804 drives a first output signal and the second terminal 805 drives a second output signal, wherein the first output signal and the second output signal have substantially equal amplitude and 180 degree phase difference.

The first terminal 804 is electrically connected to the IC 810 by a second trace 811 and the second terminal 805 is electrically connected to the IC 810 by a third trace 812. The second trace 811 and the third trace 812 are symmetric with respect to the first trace 820. In one embodiment, the length of the second trace 811 and the length of third trace 812 can be substantially the same. Accordingly, there will be an impedance consistency between the second trace 811 and the third trace 812 because the distance between the first trace 820 and the second trace 811 is substantially the same as the distance between the first trace 820 and the third trace 812.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A balance filter, comprising:
   a substrate;
   an input terminal to receive an input signal;
   a first circuit having a first terminal electrically connected to the input terminal and a second terminal to generate a first output signal, wherein the first circuit comprises a first through-hole via inductor substantially disposed in the substrate and a first horizontal inductor disposed on the top surface of the substrate, wherein the first horizontal inductor is electrically connected to the first through-hole via inductor and an inductance of the first through-hole via inductor is greater than that of the first horizontal inductor; and
   a second circuit electrically connected to the first circuit and having a third terminal to generate a second output signal, wherein the second circuit comprises a second through-hole via inductor substantially disposed in the substrate.

2. The balance filter according to claim 1, further comprising:
   a first output terminal electrically connected to the second terminal of the first circuit to output the first output signal; and a second output terminal electrically connected to the third terminal of the second circuit to output the second output signal, wherein the first output signal and the second output signal have substantially equal amplitude and 180 degree phase difference.

3. The balance filter according to claim 1, wherein the first circuit is electrically symmetric to the second circuit.

4. The balance filter according to claim 1, wherein at least one of the contact points connecting the first circuit and the second circuit is virtually grounded.

5. The balance filter according to claim 1, further comprising a power trace disposed between the first circuit and the second circuit and electrically connected to an IC.

6. The balance filter according to claim 1, wherein the second circuit further comprises a second horizontal inductor disposed on the top surface of the substrate, wherein the second horizontal inductor is electrically connected to the second through-hole via inductor, and an inductance of the second through-hole via inductor is greater than that of the second horizontal inductor.

7. The balance filter according to claim 6, wherein the resultant inductance of the first through-hole via inductor and the first horizontal inductor is substantially equal to the inductance of the first through-hole via inductor; the resultant inductance of the second through-hole via inductor and the second horizontal inductor is substantially equal to the inductance of the second through-hole via inductor.

8. The balance filter according to claim 1, wherein each of the first through-hole via inductor and the second through-hole via inductor comprises at least two materials, wherein one of said at least two materials is a conductive material.

9. The balance filter according to claim 1, wherein each of the first through-hole via inductor and the second through-hole via inductor comprises: a first conductive material overlaying the sidewall of the through-hole via of said each of the first through-hole via inductor and the second through-hole via inductor; and a second conductive material enclosed by the first conductive material.

10. The balance filter according to claim 1, wherein each of the first through-hole via inductor and the second through-hole via inductor comprises a conductive material and a non-conductive material enclosed by the conductive material.

11. The balance filter according to claim 1, wherein the substrate is a ceramic substrate.

12. The balance filter according to claim 1, wherein the first circuit further comprises: a third through-hole via inductor substantially disposed in the substrate, wherein the first horizontal inductor comprises a first end and a second end, wherein the first end is electrically connected to the first through-hole via inductor and the second end is electrically connected to the third through-hole via inductor; and wherein the second circuit further comprises: a fourth through-hole via inductor substantially disposed in the substrate; and a second horizontal inductor disposed on the top surface of the substrate, wherein the second horizontal inductor comprises a third end and a fourth end, wherein the third end is electrically connected to the second through-hole via inductor and the fourth end is electrically connected to the fourth through-hole via inductor.

13. The balance filter according to claim 12, wherein an resultant inductance of the first through-hole via inductor and the third through-hole via inductor is greater than the inductance of the first horizontal inductor, and an resultant inductance of the second through-hole via inductor and the fourth through-hole via inductor is greater than an inductance of the second horizontal inductor.

14. A layout structure, comprising:
a first layout of a first circuit having a first terminal electrically connected to an IC;
a second layout of a second circuit having a second terminal electrically connected to the IC, wherein the first layout is electrically connected to the second layout; and
a first trace disposed between the first layout and the second layout, wherein one end of the first trace is electrically connected to a power supply and the other end of the first trace is electrically connected to the IC.

15. The layout structure according to claim 14, wherein the first terminal is electrically connected to the IC by a second trace and the second terminal is electrically connected to the IC by a third trace, wherein the second trace and the third trace are symmetric with respect to the first trace.

16. The layout structure according to claim 14, wherein the power supply is a DC type.

17. The layout structure according to claim 14, wherein the first circuit and the second circuit form a balance filter, wherein the first terminal drives a first output signal and the second terminal drives a second output signal, wherein the first output signal and the second output signal have substantially equal amplitude and 180 degree phase difference.

18. The layout structure according to claim 14, wherein the second layout is electrically symmetric to the first layout.

19. A balance filter, comprising:
a substrate;
an input terminal to receive an input signal;
a first circuit having a first terminal electrically connected to the input terminal and a second terminal to generate a first output signal, wherein the first circuit comprises a first through-hole via inductor and a second through-hole via inductor substantially disposed in the substrate and a first horizontal inductor disposed on the top surface of the substrate, wherein the first horizontal inductor comprises a first end and a second end, wherein the first end of the first horizontal inductor is electrically connected to the first through-hole via inductor and the second end of the first horizontal inductor is electrically connected to the second through-hole via inductor; and
a second circuit electrically connected to the first circuit and having a third terminal to generate a second output signal, wherein the second circuit comprises a third through-hole via inductor and a fourth through-hole via inductor substantially disposed in the substrate and a second horizontal inductor disposed on the top surface of the substrate, wherein the second horizontal inductor comprises a third end and a fourth end, wherein the third end of the second horizontal inductor is electrically connected to the third through-hole via inductor and the fourth end of the second horizontal inductor is electrically connected to the fourth through-hole via inductor.

20. The balance filter according to claim 19, wherein an resultant inductance of the first through-hole via inductor and the second through-hole via inductor is greater than an inductance of the first horizontal inductor, and an resultant inductance of the third through-hole via inductor and the fourth through-hole via inductor is greater than an inductance of the second horizontal inductor.

* * * * *